United States Patent
Toyota

(10) Patent No.: US 8,309,965 B2
(45) Date of Patent: Nov. 13, 2012

(54) DISPLAY DEVICE AND MANUFACTURING METHOD THEREOF

(75) Inventor: Yoshiaki Toyota, Koshigaya (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 345 days.

(21) Appl. No.: 12/844,903

(22) Filed: Jul. 28, 2010

(65) Prior Publication Data
US 2011/0049524 A1 Mar. 3, 2011

(30) Foreign Application Priority Data
Aug. 27, 2009 (JP) .................................. 2009-196795

(51) Int. Cl.
*H01L 29/786* (2006.01)
(52) U.S. Cl. .................... 257/72; 257/59; 257/E21.414; 257/E29.294; 257/E33.053
(58) Field of Classification Search .................... 257/59, 257/72; 438/34, 149
See application file for complete search history.

(56) References Cited

U.S. PATENT DOCUMENTS

| | | | | |
|---|---|---|---|---|
| 5,177,577 A | * | 1/1993 | Taniguchi et al. | 257/59 |
| 2004/0113214 A1 | * | 6/2004 | Takenaka | 257/411 |
| 2005/0037533 A1 | * | 2/2005 | Peng et al. | 438/78 |
| 2009/0153056 A1 | * | 6/2009 | Chen et al. | 315/51 |
| 2011/0309363 A1 | * | 12/2011 | Misaki | 257/59 |
| 2012/0218485 A1 | * | 8/2012 | Chikama et al. | 349/39 |

FOREIGN PATENT DOCUMENTS
JP 2002-182239 6/2002
* cited by examiner

*Primary Examiner* — A. Sefer
(74) *Attorney, Agent, or Firm* — Antonelli, Terry, Stout & Kraus, LLP.

(57) ABSTRACT

Provided is a display device including a thin-film transistor and a capacitor element, the thin-film transistor includes: a first insulating film (IN1) which is formed to cover an area where a gate electrode (GT) is formed; a second insulating film (IN2) which is formed on the first insulating film, the second insulating film having an opening (OP) formed in the area in plan view; a semiconductor layer (SCLt) which is formed on the second insulating film to cross the opening, the semiconductor layer including high concentration areas (CN); a third insulating film (IN3) which is formed on the semiconductor layer to expose apart of each of the high concentration areas; and a pair of electrodes (DT, ST) each having electrical connection to the part; and the capacitor element includes a dielectric film which is formed of the same layer and the same material as the third insulating film.

12 Claims, 14 Drawing Sheets

DISPLAY DEVICE AND MANUFACTURING METHOD THEREOF

CROSS-REFERENCE TO RELATED APPLICATION

The present application claims priority from Japanese application JP 2009-196795 filed on Aug. 27, 2009, the content of which is hereby incorporated by reference into this application.

BACKGROUND OF THE INVENTION

1. Field of the Invention

The present invention relates to a display device and a manufacturing method therefor, and more particularly, to a display device including thin-film transistors or the like on a substrate forming a display section, and a manufacturing method therefor.

2. Description of the Related Art

In an active matrix liquid crystal display device, for example, gate signal lines and drain signal lines are formed on a liquid crystal side-surface of one of a pair of substrates arranged to face each other while sandwiching liquid crystal therebetween. The gate signal lines extend in an x direction and are arranged in parallel to one another in a y direction. The drain signal lines extend in the y direction and are arranged in parallel to one another in the x direction. Rectangular areas surrounded by the gate signal lines and the drain signal lines are each referred to as pixel area.

Each pixel area includes at least a thin-film transistor which is driven by a signal (scanning signal) from the gate signal line, and a pixel electrode supplied with a signal (image signal) from the drain signal line through the thin-film transistor. The pixel electrode generates an electric field which drives the liquid crystal, with a counter electrode formed on one substrate on which the pixel electrode is formed or on another substrate which is disposed to face the one substrate.

In this case, a capacitor element is generally formed in each pixel so that the image signal is stored in the pixel electrode for a relatively long time. The capacitor element includes one electrode electrically connected to the pixel electrode, and another electrode electrically connected to a capacitor signal line which is simultaneously formed with a formation of, for example, the gate signal line. The capacitor signal line is supplied with a reference signal which serves as a reference with respect to the image signal.

Further, the insulating film which serves as the dielectric film of the capacitor element uses the same insulating film formed as the gate insulating film of the thin-film transistor. Therefore, the dielectric film of the capacitor element and the gate insulating film of the thin-film transistor are formed of the same material and with the same film thickness (see Japanese Patent Application Laid-open No. 2002-182239).

Note that, in some liquid crystal display devices, a scanning signal drive circuit for supplying the scanning signal to the gate signal line and an image signal drive circuit for supplying the image signal to the drain signal line are formed at a circumference of the display section on the same substrate. The scanning signal drive circuit and the image signal drive circuit include a plurality of thin-film transistors formed in parallel to the formation of the thin-film transistors formed in the pixels.

SUMMARY OF THE INVENTION

In the above-mentioned liquid crystal display device, the dielectric film of the capacitor element and the gate insulating film of the thin-film transistor are formed of the same material and with the same film thickness.

However, each of the gate insulating film of the thin-film transistor and the dielectric film of the capacitor element is required to be formed at an appropriate film thickness depending on characteristics thereof.

An object of the present invention is to provide a display device and a manufacturing method therefor which are capable of setting, by using insulating films formed in different layers as a gate insulating film of a thin-film transistor and a dielectric film of a capacitor element, an appropriate film thickness depending on characteristics thereof, without increasing the number of manufacturing processes.

A structure of the present invention may be exemplified as follows.

(1) According to the present invention, there is provided a display device including a thin-film transistor and a capacitor element which are formed on a substrate, in which:

the thin-film transistor includes:
  a first insulating film which is formed to cover an area where a gate electrode is formed;
  a second insulating film which is formed on the first insulating film, the second insulating film having an opening formed in the area where the gate electrode is formed in plan view;
  a semiconductor layer which is formed in an island shape on the second insulating film to cross the opening and is polycrystalline, the semiconductor layer including high concentration areas formed at both ends of the semiconductor layer;
  a third insulating film which is formed on an upper surface of the semiconductor layer to expose a part of each of the high concentration areas formed at the both ends of the semiconductor layer; and
  a pair of electrodes each having electrical connection to the part of each of the high concentration areas formed at the both ends of the semiconductor layer, the part being exposed at the third insulating film; and the capacitor element includes a dielectric film which is formed of an insulating film formed of the same layer and the same material as the third insulating film.

(2) According to the present invention, there is provided a manufacturing method for a display device including a thin-film transistor and a capacitor element which are formed on a substrate, in which:

the thin-film transistor is formed by:
  a first step of forming a first insulating film which covers an area where a gate electrode is formed on the substrate;
  a second step of forming a second insulating film on the first insulating film and forming an opening in the area where the gate electrode is formed in plan view;
  a third step of sequentially forming an amorphous semiconductor layer and a third insulating film, the amorphous semiconductor layer having a high concentration area in an area excluding an area on the opening in the second insulating film and a peripheral portion thereof in plan view;
  a fourth step of performing annealing to the amorphous semiconductor layer to obtain a polycrystalline semiconductor layer;
  a fifth step of performing selective etching to leave a part of the third insulating film on the opening in the second insulating film and the peripheral portion thereof in plan view, and performing selective etching to leave a part of the polycrystalline semiconductor layer in a state in which the high concentration area is exposed in a circumference of the part of the third insulating film unetched; and a sixth step of forming a pair of electrodes which contact with the high concentration area in the semiconductor layer, the high concentration area being exposed at the third insulating film; and the capacitor element includes a dielectric film formed by subjecting the third insulating film formed in the third step to the selective etching of the third insulating film in the fifth step.

Further, according to an aspect of the display device of the present invention, the thin-film transistor may include a polycrystalline semiconductor layer reliably obtained by annealing an amorphous semiconductor, and may further have a structure capable of reducing an offset current.

Note that, the above-mentioned structure is merely an example, and the present invention may be appropriately changed without departing from the technical idea of the present invention. Further, examples of the structure of the present invention other than that described above are made apparent from the entire description of the specification or the accompanying drawings of the present application.

According to the display device and the manufacturing method therefor as described above, by using insulating films formed in different layers as the gate insulating film of the thin-film transistor and the dielectric film of the capacitor element, an appropriate film thickness depending on characteristics thereof may be set, without increasing the number of manufacturing processes.

Other effects of the present invention may be made apparent from the entire description in the specification.

DETAILED DESCRIPTION OF THE INVENTION

Figure 1:
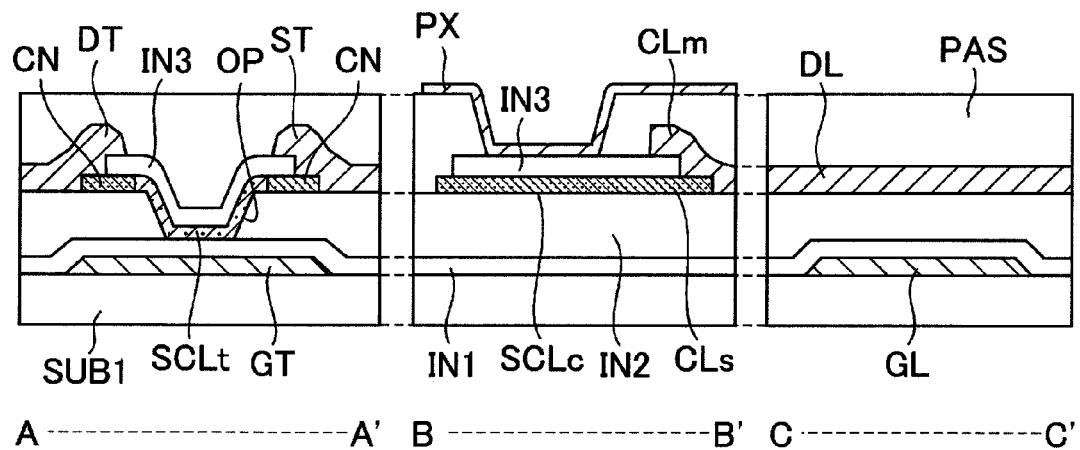
FIG. 1 is a cross-sectional view illustrating a principal part of a display device according to a first embodiment of the present invention.

Hereinafter, embodiments of the present invention are described with reference to the attached drawings. Note that, the same or similar components are denoted by the same reference symbols in the drawings and the embodiments, and the overlapping description thereof is omitted.

[First Embodiment]

A liquid crystal display device according to a first embodiment of the present invention is described as an example.

[Equivalent Circuit]

Figure 2:
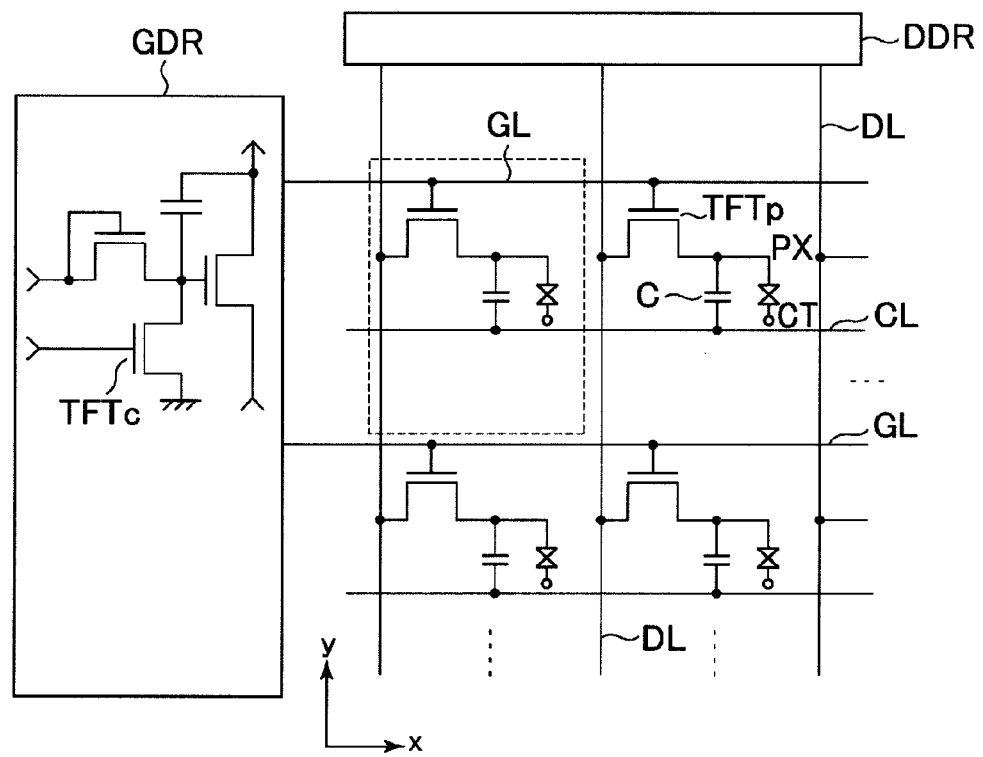
FIG. 2 is a diagram illustrating an equivalent circuit of a display area of the display device according to the first embodiment of the present invention.

FIG. 2 is a diagram illustrating an equivalent circuit of the liquid crystal display device according to the first embodiment. FIG. 2 illustrates a circuit formed on a liquid crystal side surface of one substrate of a pair of substrates arranged to face each other while sandwiching liquid crystal therebetween. Even though FIG. 2 illustrates an equivalent circuit, the equivalent circuit is geometrically substantially similar to an actual circuit of the liquid crystal display device.

In FIG. 2, there are provided gate signal lines GL and drain signal lines DL. The gate signal lines GL extend in an x direction of FIG. 2 and are arranged in parallel to one another in a y direction of FIG. 2. The drain signal lines DL extend in the y direction and are arranged in parallel to one another in the x direction. For example, a left end of each of the gate signal lines GL of FIG. 2 is connected to a gate driver GDR so that a scanning signal is supplied to each of the gate signal lines GL by the gate driver GDR. Further, for example, an upper end of each of the drain signal lines DL of FIG. 2 is connected to a drain driver DDR so that an image signal is supplied to each of the drain signal lines DL by the drain driver DDR.

An area surrounded by a pair of gate signal lines GL adjacent to each other and a pair of drain signal lines DL adjacent to each other is a pixel area (area surrounded by dotted-line frame illustrated in FIG. 2). The area includes a thin-film transistor TFT (denoted by reference symbol TFTp in FIG. 2) and a pixel electrode PX. The thin-film transistor TFT is turned ON by the scanning signal from the gate signal line GL. Through the thin-film transistor TFTp which is turned ON, the image signal from the drain signal line DL is supplied to the pixel electrode PX. The pixel electrode PX generates an electric field with a counter electrode CT formed on another substrate which is disposed to face the one substrate on which the pixel electrode PX is formed. On the one substrate on which the pixel electrode PX is formed, capacitor signal lines CL are formed adjacent to the gate signal lines GL. A capacitor element C is connected between the capacitor signal line CL and the pixel electrode PX. The capacitor element C is provided to store the image signal supplied to the pixel electrode PX for a relatively long time. The electrical field generated between the pixel electrode PX and the counter electrode CT is vertical to the surfaces of the substrates, and molecules of the liquid crystal are driven by the electrical field. The liquid crystal display device including the pixels as described above is called, for example, a longitudinal electric-field type liquid crystal display device.

Note that, here, the gate driver GDR is formed so as to include, for example, a bootstrap circuit. The bootstrap circuit includes a plurality of thin-film transistors TFT (denoted by reference symbol TFTc in FIG. 2). The thin-film transistors TFTc are formed on the same substrate, on which the thin-film transistor TFTp formed in each pixel is formed, and are formed concurrently with the formation of the thin-film transistor TFTp.

[Pixel Structure]

Figure 3:
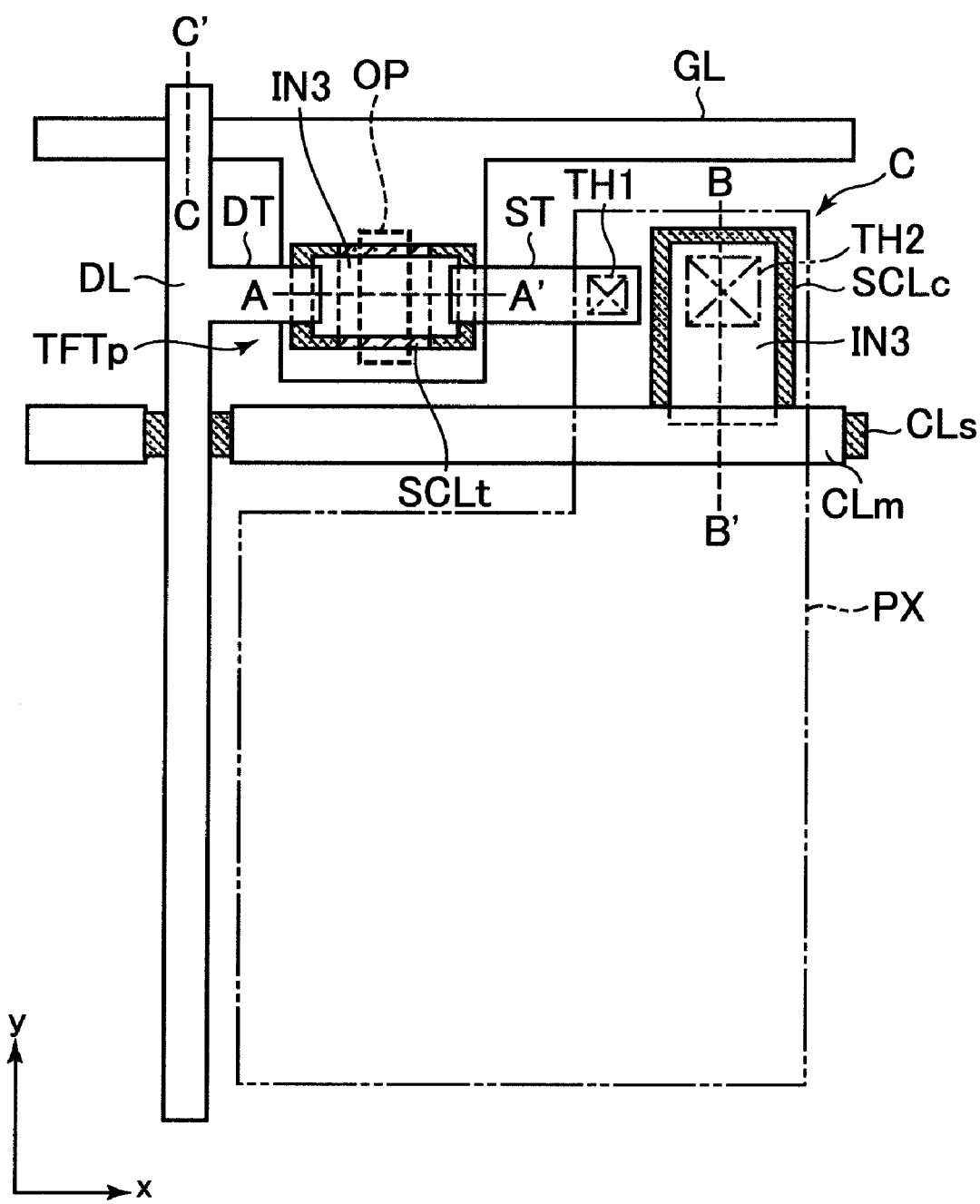
FIG. 3 is a plan view illustrating a pixel structure of the display device according to the first embodiment of the present invention.

FIG. 3 is a plan view illustrating a schematic structure of the pixel area (area surrounded by dotted-line frame illustrated in FIG. 2). Further, schematic cross-sectional views taken along the line A-A', the line B-B', and the line C-C' of FIG. 3 are illustrated in the part A-A', the part B-B', and the part C-C' of FIG. 1, respectively.

In FIG. 3, a substrate SUB1 (see FIG. 1) is first provided. The gate signal line GL is formed on a plane (surface) of the substrate SUB1 on the liquid crystal side so as to extend in the x direction of FIG. 3. The gate signal line GL has an extending portion which is protruded to an inner side of each pixel area in part, and the extending portion serves as a gate electrode GT of the thin-film transistor TFTp described later.

On the surface of the substrate SUB1, a first insulating film IN1 (see FIG. 1) made of, for example, silicon oxide is formed so as to cover the gate signal line GL and the gate electrode GT as well. The first insulating film IN1 functions as a gate insulating film in an area where the thin-film transistor TFT is formed. Further, on an upper surface of the first insulating film IN1, a second insulating film IN2 made of, for example, silicon nitride is formed. The second insulating film IN2 has a film thickness larger than that of the first insulating film IN1. Further, the second insulating film IN2 has an opening OP formed therein on a part of the gate electrode GT in the area where the thin-film transistor TFTp is formed. The opening OP has a rectangular shape having long sides in a direction (y direction of FIG. 3) orthogonal to a running direction of the gate signal lines GL. The opening OP is formed so that the surface of the first insulating film IN1 is exposed at a bottom of the opening OP. As is apparent from FIG. 1, the opening OP is formed so as to have a relatively moderately tapered side wall surface.

On an upper surface of the second insulating film IN2, a semiconductor layer SCL for the thin-film transistor TFT (denoted by SCLt in FIGS. 1 and 3) and a semiconductor layer SCL serving as one electrode of the capacitor element C (denoted by SCLc in FIGS. 1 and 3) are formed. The semiconductor layer SCLt for the thin-film transistor TFTp is formed so as to straddle the opening OP formed in the second insulating film IN2, along an extending direction of the gate signal line GL (x direction of FIG. 3). Further, when a portion of the semiconductor layer SCLt on the opening is assumed as the center, both ends thereof are high concentration semiconductor layers (denoted by CN in FIG. 1). The high concentration semiconductor layers are formed on the surface (on surface of portion excluding the opening OP) of the second insulating film IN2. Note that, the semiconductor layer SCLt described above is formed by crystallizing an amorphous silicon layer into a polysilicon layer by laser annealing. The high concentration semiconductor layer CN is formed by performing high concentration impurity doping. The semiconductor layer SCLt formed as described above has, as illustrated in FIG. 1, a portion formed on the bottom surface of the opening OP, which serves as a channel region. Further, both sides of the channel region are connected to the high concentration semiconductor layers CN through tapered portions of the opening OP, respectively. The semiconductor layer SCLt formed at the tapered portion of the opening OP has a role of an offset. Therefore, an electric field at a drain end may be alleviated, to thereby reduce an off current. The semiconductor layer SCLc serving as the one electrode of the capacitor element C is formed simultaneously with, for example, the capacitor signal line CL (denoted by reference symbol CLs in FIGS. 1 and 3). The semiconductor layer SCLc and the capacitor signal line CLs are both formed as high concentration semiconductor layers formed by crystallizing amorphous silicon layers into polysilicon layers by laser annealing and performing high concentration impurity doping.

Here, in the area where the thin-film transistor TFT is formed, a third insulating film IN3 is formed on the surface of the semiconductor layer SCLt. The third insulating film IN3 is formed so that at least apart of each of the high concentration semiconductor layers CN at the both ends of the semiconductor layer SCLt is exposed. This structure is employed for electrical connection between electrodes (drain electrode and source electrode) described later. The third insulating film IN3 is formed so that the semiconductor layer SCLt is formed without stepped separation along the tapered shape of the opening OP in the second insulating film IN2. As described above, the semiconductor layer SCLt is formed by crystallizing the semiconductor layer formed of amorphous silicon into a polysilicon layer by laser annealing. Negative effects generated by melting due to the laser annealing may be avoided by the formation of the third insulating film IN3. Further, the third insulating film IN3 and the semiconductor layer SCLt are formed so as to cross the opening OP in a lateral direction of FIG. 1 in plan view. In addition, the third insulating film IN3 is also formed in an area where the capacitor element C is formed, and is formed so as to cover the semiconductor layer SCLc. The third insulating film IN3 functions as a dielectric film of the capacitor element C. In this case, the dielectric film may be formed simultaneously with the third insulating film IN3 formed for the thin-film transistor TFT, and hence increase of the number of manufacturing processes may be avoided. In this case, the third insulating film IN3 is formed so that a part of the semiconductor layer SCLc is exposed at a connection portion to the capacitor signal line CLs. This structure is employed for electrical connection to a capacitor signal line CL (denoted by reference symbol CLm in FIGS. 1 and 3) formed of a metal film, which is described later.

On a surface above the substrate SUB1 formed as described above, the drain signal line DL which extends in the y direction of FIG. 3 is formed. The drain signal line DL extends so that a part thereof overlaps the high concentration semiconductor layer CN on a one end side (end portion on drain signal line DL side) of the semiconductor layer SCLt of the thin-film transistor TFT, to thereby form a drain electrode DT of the thin-film transistor TFT. Further, simultaneously with formation of the drain electrode DT, a source electrode ST which overlaps the high concentration semiconductor layer CN formed on another end side of the semiconductor layer SCLt is formed. The source electrode ST extends outside the area where the semiconductor layer SCLt is formed, to thereby form a connection portion to the pixel electrode PX (denoted by reference symbol TH1 in FIG. 3) which is described later. Note that, in the thin-film transistor TFT, the drain electrode DT and the source electrode ST are alternated in accordance with application of a bias voltage. However, for ease of description, it is assumed that the electrode positioned on the left side of FIGS. 1 and 3 is the drain electrode, and the electrode positioned on the right side of FIGS. 1 and 3 is the source electrode. Further, during the formation of the drain signal line DL or the like, the capacitor signal line CLm is formed. The capacitor signal line CLm has a cutting portion at a portion where the capacitor signal line CLm intersects with the drain signal line DL, and is formed so as to overlap the capacitor signal line CLs formed of the high concentration semiconductor layer.

Note that, the C-C' part of FIG. 1 is a cross-sectional view at an intersecting portion of the gate signal line GL and the drain signal line DL. The first insulating film IN1 and the second insulating film IN2 are used as an interlayer insulating film formed between the gate signal line GL and the drain signal line DL.

Here, in the above-mentioned liquid crystal display device (see Japanese Patent Application Laid-open No. 2002-182239), even the interlayer insulating film at the intersecting portion of the gate signal line and the drain signal line is formed of an insulating film formed of the same material and having the same thickness as the gate insulating film of the thin-film transistor TFT. Therefore, when the gate insulating film and the dielectric film are to be formed in thin films in order to improve characteristics of the thin-film transistor and increase a capacitance of the capacitor element, there may occur a disadvantage that a parasitic capacitance between the gate signal line and the drain signal line may be increased and a drive speed of the liquid crystal display device may be reduced. However, like this embodiment, by using the first insulating film IN1 and the second insulating film IN2 as the interlayer insulating film formed between the gate signal line GL and the drain signal line DL, not only the gate insulating film and the dielectric film but also the interlayer insulating film may be formed in a thickness appropriate for the characteristics thereof. In this manner, increase of the number of manufacturing processes may be suppressed, and further a parasitic capacitance between the gate signal line and the drain signal line may be reduced.

On a surface above the substrate SUB1 formed as described above, a protective film PAS is formed. The protective film PAS is formed of an organic insulating film made of, for example, a resin, to thereby avoid direct contact between the liquid crystal and the thin-film transistor TFT. This structure is employed because the contact between the thin-film transistor TFT and the liquid crystal causes deterioration of characteristics of the thin-film transistor TFT. On an upper surface of the protective film PAS in the pixel area, the pixel electrode PX in a plane shape is formed. The pixel electrode PX is formed of a transparent conductive film made of, for example, indium tin oxide (ITO). Further, an extending portion of the pixel electrode PX is connected to the source electrode ST of the thin-film transistor TFTp through a through hole TH1 formed in the protective film PAS in advance. Further, the extending portion of the pixel electrode PX is formed on the third insulating film IN3 which is the dielectric film of the capacitor element C through a through hole TH2 formed in the protective film PAS in advance. With this structure, a portion of the pixel electrode PX formed in the through hole TH2 serves as another electrode of the capacitor element C, and by increasing an area of an opening of the through hole TH2, larger capacitance may be obtained.

Note that, on a surface above the substrate SUB1 formed as described above, an alignment layer covering the pixel electrode PX as well is formed. However, the alignment layer is not shown in FIGS. 1 and 3.

[Structure of Part of Gate Driver]

Figure 4:
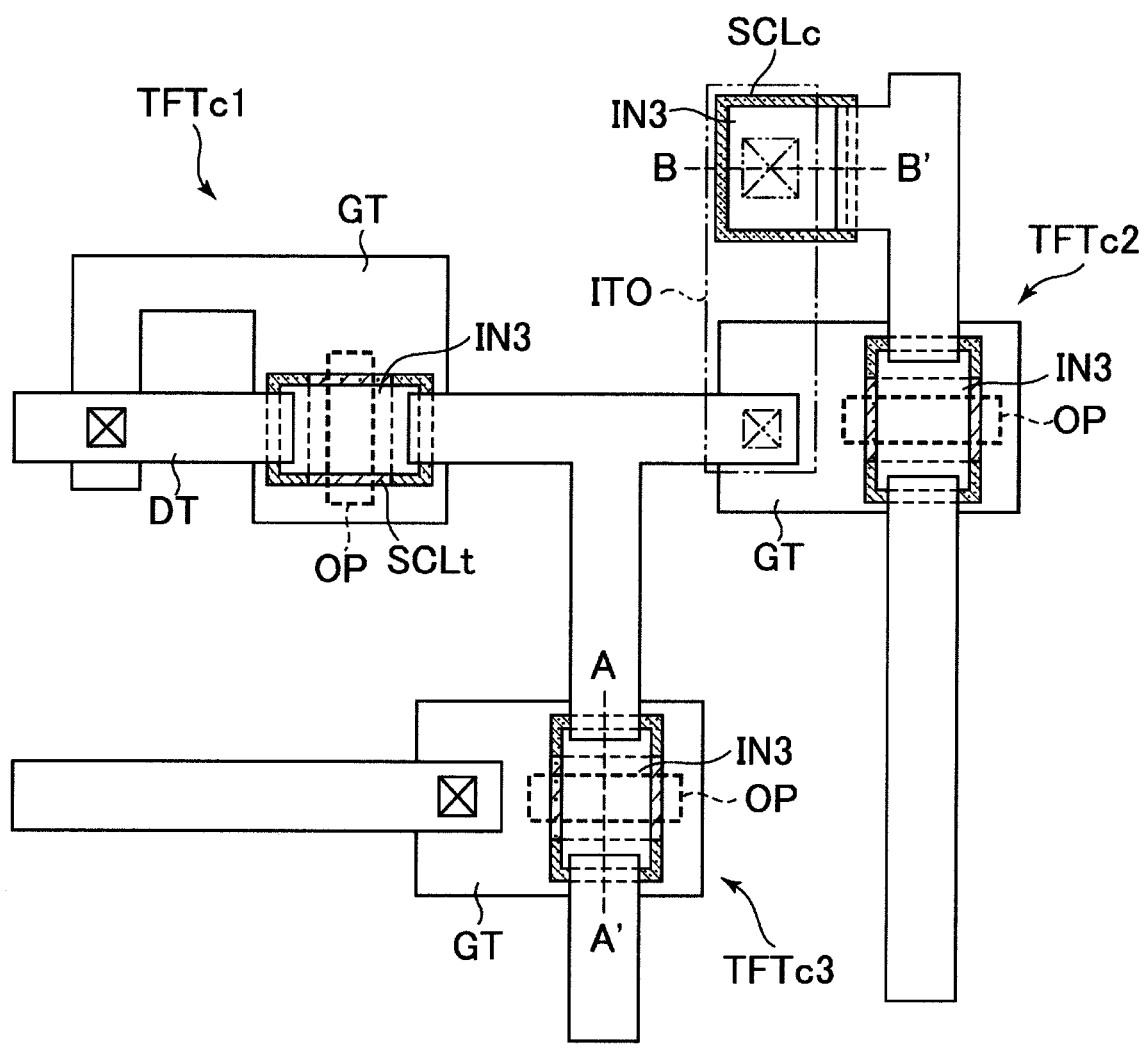
FIG. 4 is a plan view illustrating a structure of a bootstrap circuit formed in the display device according to the first embodiment of the present invention.

FIG. 4 is a schematic plan view illustrating the bootstrap circuit forming a part of the gate driver GDR. FIG. 4 is provided so as to geometrically correspond to the bootstrap circuit (equivalent circuit) illustrated in FIG. 2. Further, schematic cross-sectional views taken along the line A-A' and the line B-B' of FIG. 4 are substantially similar to the schematic cross-sectional views of the part A-A' and the part B-B' of FIG. 1, respectively.

In FIG. 4, three thin-film transistors TFTc are formed (denoted by reference symbols TFTc1, TFTc2, and TFTc3, respectively, in FIG. 4). The thin-film transistors TFTc1, TFTc2, and TFTc3 are formed concurrently with the formation of the thin-film transistor TFTp in the pixel area. Therefore, the thin-film transistors TFTc1, TFTc2, and TFTc3 are all formed to be bottom-gate type thin-film transistors, and the semiconductor layer thereof is formed of the semiconductor layer SCLt formed by crystallizing an amorphous silicon layer into a polysilicon layer by laser annealing. Negative effects generated by melting of the semiconductor layer SCLt due to the laser annealing are avoided by the third insulating film IN3. Here, the thin-film transistor TFTc1 is formed so that the gate electrode GT is electrically connected to the drain electrode DT, to thereby function as a diode.

Further, in the capacitor element C, the upper layer electrode is formed of a transparent conductive film ITO made of, for example, indium tin oxide (ITO) or the like. This is for forming the upper layer electrode simultaneously with the formation of the pixel electrode PX in the pixel area. Further, the upper layer electrode in the capacitor element C is formed integrally with wiring having relatively short wiring length, and is connected to one of the electrodes of the source electrode and the drain electrode (electrode on right side of FIG. 4) of the thin-film transistor TFTc1, one of the electrodes of the source electrode and the drain electrode (electrode on upper side of FIG. 4) of the thin-film transistor TFTc3, and the gate electrode GT of the thin-film transistor TFTc2.

Note that, the thin-film transistors TFTc described above are thin-film transistors formed in the gate driver GDR. However, the structure of such thin-film transistors may also be applied to a thin-film transistor formed in the drain driver DDR. In other words, the structure may be applied to any thin-film transistors forming a circuit formed in the periphery of the display section (peripheral circuit).

[Manufacturing Method]

A manufacturing method of the display device is described with reference to FIGS. 5 to 11. FIGS. 5 to 11 are diagrams provided so as to correspond to the A-A' part, the B-B' part, and the C-C' part of FIG. 1. Hereinafter, steps are described in order of manufacture.

Figure 5:
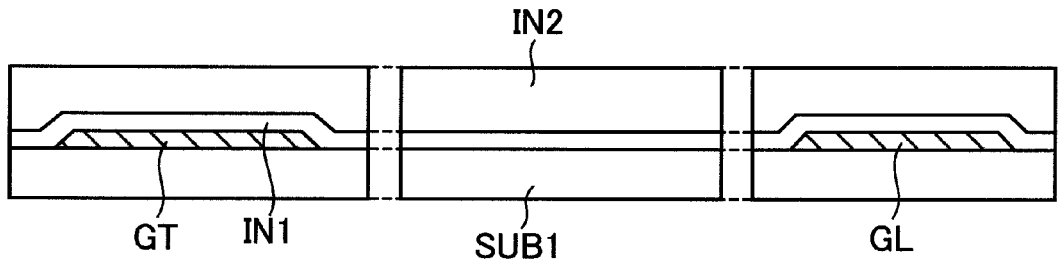
FIG. 5 is a view illustrating a step of a manufacturing method for the display device according to the first embodiment of the present invention, and illustrates a series of steps together with FIGS. 6 to 11.

Step 1 (FIG. 5)

The substrate SUB1 made of, for example, glass is prepared, and the gate signal line GL and the gate electrode GT which are made of, for example, aluminum, are formed on the surface of the substrate SUB1. The film thickness of each of the gate signal line GL and the gate electrode GT is, for example, 150 nm. After that, on the surface of the substrate SUB1, the first insulating film IN1 made of silicon oxide and the second insulating film IN2 made of silicon nitride are sequentially formed so as to cover the gate signal line GL and the gate electrode GT as well. The first insulating film IN1 and the second insulating film IN2 are sequentially formed by, for example, a chemical vapor deposition (CVD) method. The first insulating film IN1 has a thickness of, for example, 100 nm, and the second insulating film IN2 has a thickness of, for example, 500 nm.

Figure 6:
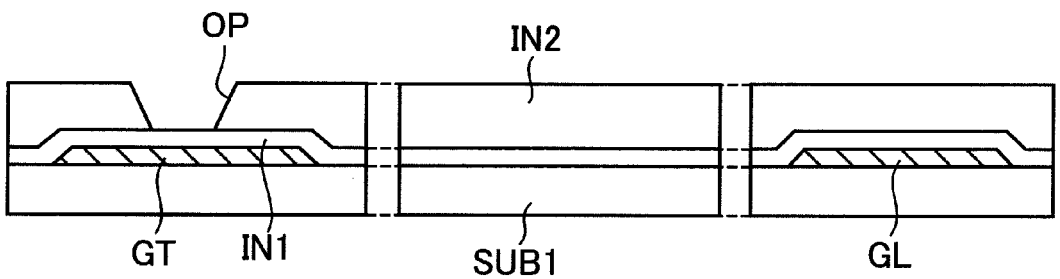
FIG. 6 is a view illustrating a step of the manufacturing method for the display device according to the first embodiment of the present invention, and illustrates a series of steps together with FIG. 5 and FIGS. 7 to 11.

Step 2 (FIG. 6)

The opening OP is formed in the second insulating film IN2 in the area where the thin-film transistor TFT is formed. The opening OP is formed on the upper side of the gate electrode GT, and is formed so as to have a tapered side wall surface. The opening OP is formed by well-known photo-etching. During photo-etching, a hole may be prevented from being formed in the first insulating film IN1 because of difference in etching rate.

Figure 7:
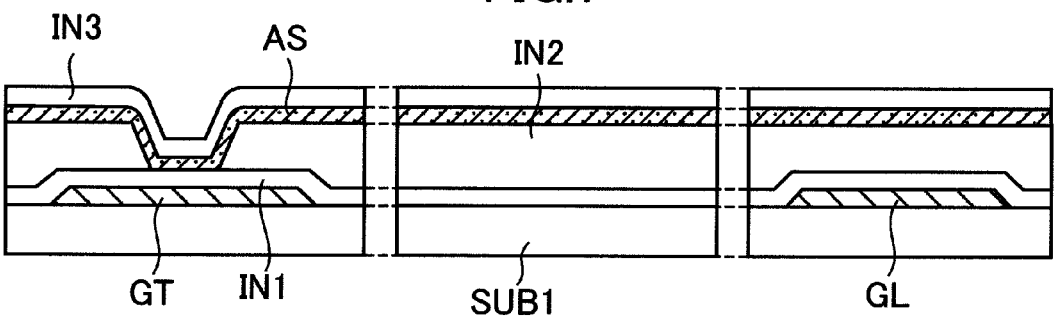
FIG. 7 is a view illustrating a step of the manufacturing method for the display device according to the first embodiment of the present invention, and illustrates a series of steps together with FIGS. 5 and 6 and FIGS. 8 to 11.

Step 3 (FIG. 7)

On the upper surface of the second insulating film IN2, a semiconductor layer AS made of amorphous silicon and the third insulating film IN3 made of silicon oxide are sequentially formed so as to cover the opening OP as well. The semiconductor layer AS and the third insulating film IN3 are sequentially formed by, for example, the CVD method. The semiconductor layer AS has a thickness of, for example, 50 nm, and the third insulating film IN3 has a thickness of, for example, 200 nm.

Figure 8:
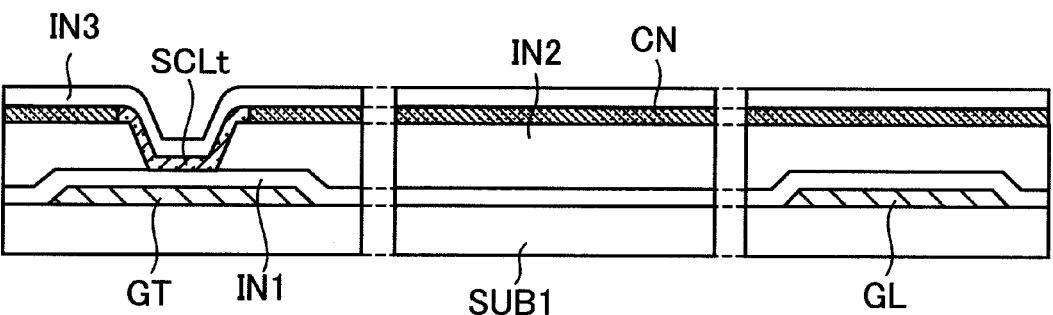
FIG. 8 is a view illustrating a step of the manufacturing method for the display device according to the first embodiment of the present invention, and illustrates a series of steps together with FIGS. 5 to 7 and FIGS. 9 to 11.

Step 4 (FIG. 8)

Ion implantation is performed on the semiconductor layer AS through the third insulating film IN3. In this case, a mask is formed to avoid performing ion implantation on a part of the semiconductor layer AS, which is formed on the opening OP in the second insulating film IN2 and the periphery thereof. After that, the semiconductor layer AS is subjected to laser annealing. The high concentration semiconductor layer CN having low resistance is formed at the portion where ion implantation is performed, while the polycrystalline semiconductor layer SCL is formed at the portion where ion implantation is avoided. Note that, in the crystallization step using laser annealing, the semiconductor layer AS made of amorphous silicon is once melted. However, because the third insulating film IN3 is formed, the polycrystalline semiconductor layer SCL may be formed without stepped separation along the tapered surface of the opening OP in the second insulating film IN2.

Figure 9:
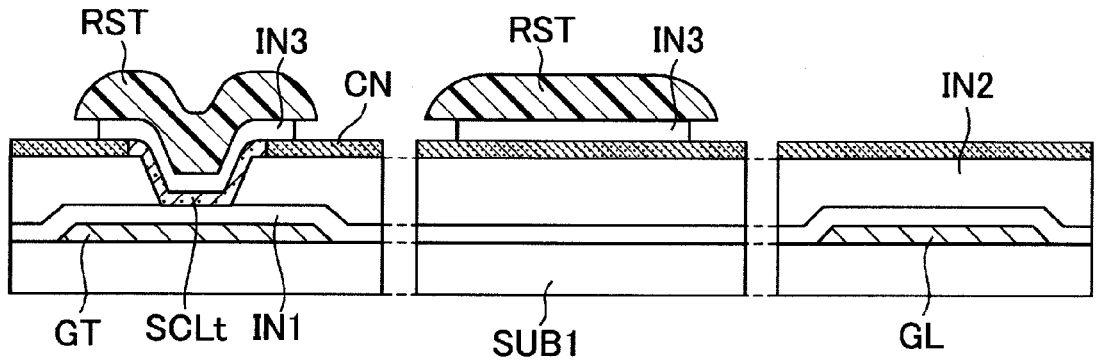
FIG. 9 is a view illustrating a step of the manufacturing method for the display device according to the first embodiment of the present invention, and illustrates a series of steps together with FIGS. 5 to 8 and FIGS. 10 and 11.

Step 5 (FIG. 9)

A photo resist is applied onto the upper surface of the third insulating film IN3. By performing a photolithography technology, photo resist films RST are left unremoved. The photo resist films RST are formed as follows. In the area where the thin-film transistor TFT is formed, the photo resist film RST covering the area of the opening in the second insulating film IN2 and the area outside the opening where the high concentration semiconductor layer CN is formed is left unremoved. Further, in the area where the capacitor element C is formed, the photo resist film RST in a shape corresponding to a pattern of the electrode (lower layer electrode) which may be formed of the high concentration semiconductor layer CN is left unremoved. After that, using the unremoved photo resist films RST as a mask, the third insulating film IN3 is etched, to thereby expose the high concentration semiconductor layer CN formed below the third insulating film IN3. In this case, the third insulating film IN3 is side-etched with respect to the photo resist film RST. A side-etching amount in this case is preferred to be equal to or larger than 1 μm.

Figure 10:
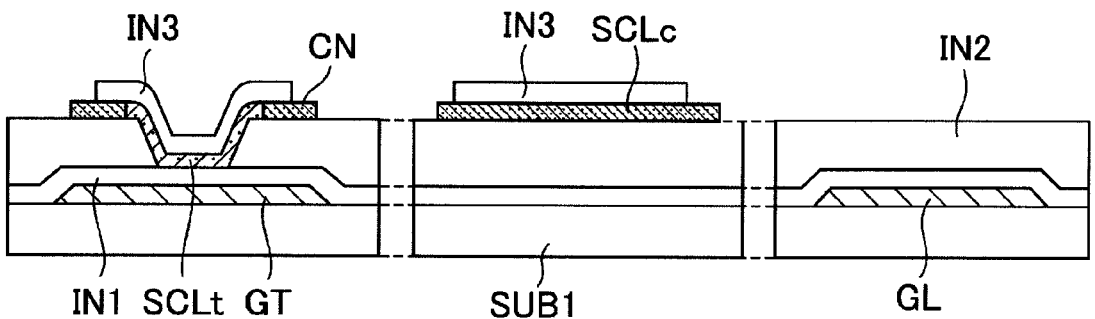
FIG. 10 is a view illustrating a step of the manufacturing method for the display device according to the first embodiment of the present invention, and illustrates a series of steps together with FIGS. 5 to 9 and FIG. 11.

Step 6 (FIG. 10)

Using the photo resist films RST as a mask, the high concentration semiconductor layer is etched, to thereby expose the second insulating film IN2 formed below the high concentration semiconductor layer. Then, the photo resist films RST are removed. By the side-etching step of the third insulating film IN3 in Step 5, the high concentration semiconductor layer CN is exposed in the circumference of the third insulating film IN3 in plan view.

Figure 11:
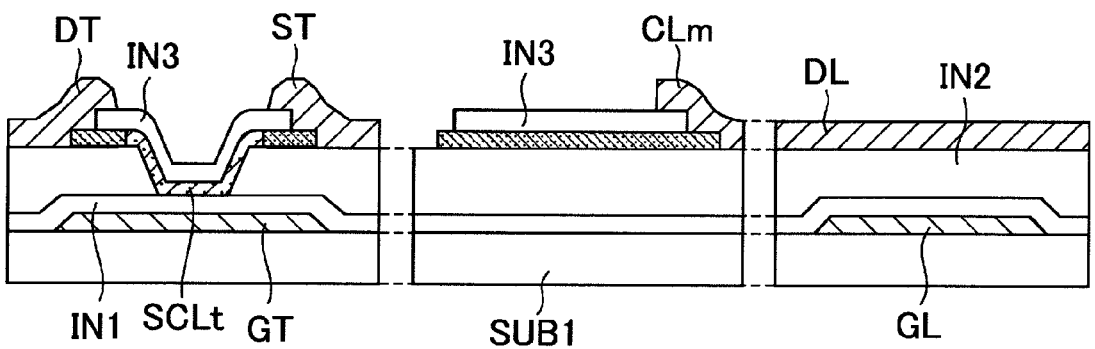
FIG. 11 is a view illustrating a step of the manufacturing method for the display device according to the first embodiment of the present invention, and illustrates a series of steps together with FIGS. 5 to 10.

Step 7 (FIG. 11)

Electrodes and wirings are formed by applying, for example, aluminum onto a surface above the substrate SUB1, and then patterning the aluminum film. The aluminum film has a thickness of, for example, 500 nm. In the area where the thin-film transistor TFT is formed, the drain electrode DT and the source electrode ST are formed. Those electrodes are formed so as to overlap at least the high concentration semiconductor layer CN exposed in the circumference of the third insulating film IN3. In the area where the capacitor element C is formed, the wiring (capacitor signal line CLm) which overlaps the high concentration semiconductor layer (lower electrode) exposed in the circumference of the third insulating film IN3 which becomes the dielectric film, and is connected to the lower electrode is formed. In the area where the wiring intersecting portion is formed, the drain signal line DL intersecting with the gate signal line GL is formed. The first insulating film IN1 and the second insulating film IN2 function as the interlayer insulating film.

After that, as illustrated in FIG. 1, the protective film PAS made of, for example, a resin material is formed on a surface above the substrate SUB1. The protective film PAS has a thickness of, for example, 300 nm. Further, in the area where the capacitor element C is formed, the through hole TH2 exposing a part of the third insulating film IN3 is formed in the protective film PAS. Further, an electrode brought into contact with the third insulating film IN3 is formed through the through hole TH2. The electrode is made of, for example, ITO, and becomes the upper electrode of the capacitor element C.

[Second Embodiment]

[Pixel Structure]

Figure 12:
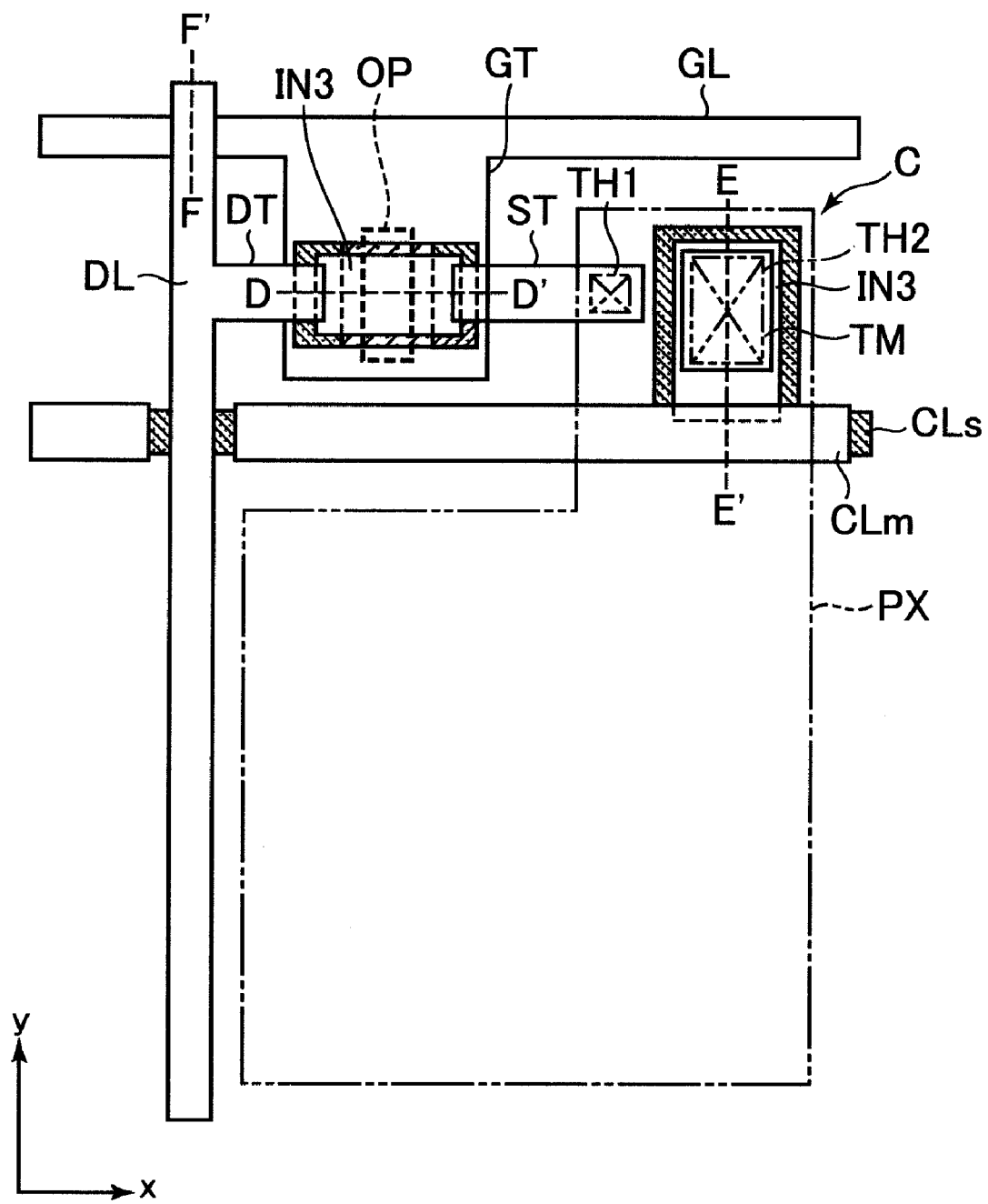
FIG. 12 is a plan view illustrating a pixel structure of a display device according to a second embodiment of the present invention.

FIG. 12 is a schematic plan view illustrating a pixel, which corresponds to FIG. 3. Further, schematic cross-sectional views taken along the line D-D', the line E-E', and the line F-F' of FIG. 12 are illustrated in the part D-D', the part E-E', and the part F-F' of FIG. 14, respectively.

Figure 14:
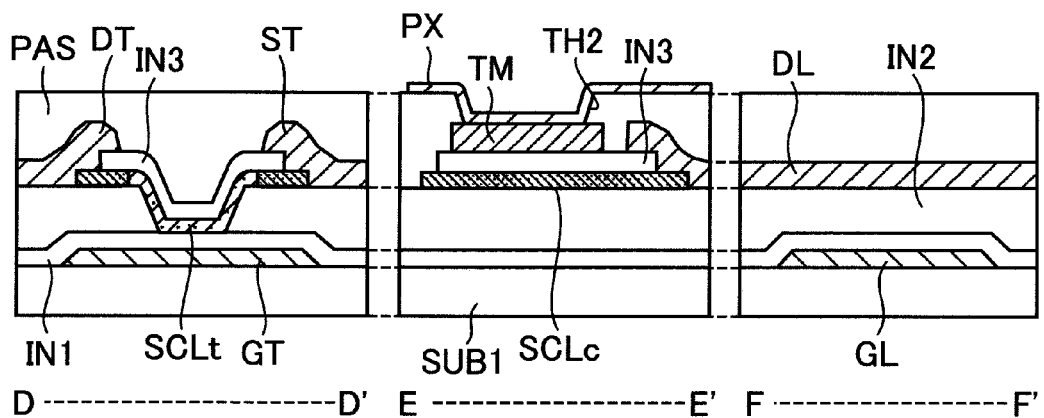
FIG. 14 is a cross-sectional view illustrating a principal part of the display device according to the second embodiment of the present invention.

As is apparent from FIGS. 12 and 14, a structure in the area where the capacitor element C is formed is different from that of the first embodiment. That is, a maintaining electrode TM is formed in the upper layer of the third insulating film IN3 which functions as the dielectric film. The maintaining electrode TM is formed simultaneously with the formation of the drain signal line DL, the drain electrode DT and the source electrode ST of the thin-film transistor TFT, and the capacitor signal line CLm. The maintaining electrode TM is formed of, for example, aluminum. Further, the maintaining electrode TM is formed in the lower layer of the protective film PAS. Therefore, the maintaining electrode TM may be electrically connected to the pixel electrode PX formed on the upper surface of the protective film PAS through the through hole TH2 formed in the protective film PAS.

With this structure, when the through hole TH2 is formed in the protective film PAS, the maintaining electrode TM functions as an etching stopper. Therefore, the dielectric film (third insulating film IN3) formed below the maintaining electrode TM is not damaged. In this manner, a capacitor element C having an improved withstand voltage may be formed.

[Structure of Part of Gate Driver]

Figure 13:
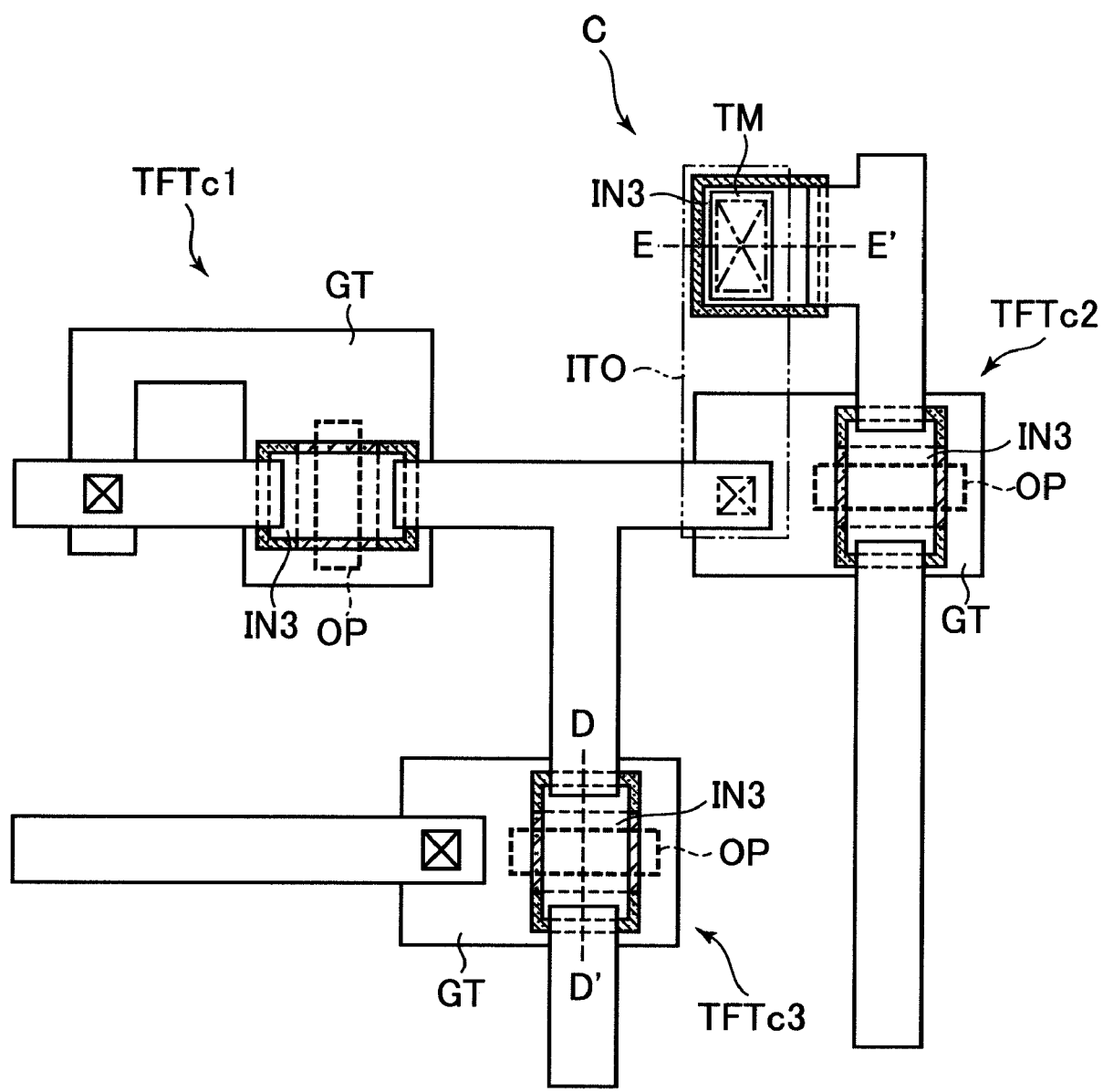
FIG. 13 is a plan view illustrating a structure of a bootstrap circuit formed in the display device according to the second embodiment of the present invention.

FIG. 13 is a schematic plan view illustrating a part of the gate driver, which corresponds to FIG. 4. Schematic cross-sectional views taken along the line D-D' and the line E-E' of FIG. 13 are substantially similar to the cross-sectional views of the part D-D' and the part E-E' of FIG. 14, respectively.

Even in this case, a structure in the area where the capacitor element C is formed is different from that in the case of FIG. 4. That is, the maintaining electrode TM is formed in the upper layer of the third insulating film IN3 which functions as the dielectric film. The capacitor element C in which the maintaining electrode TM is formed has the similar structure as the capacitor element C in the pixel area of the second embodiment.

[Manufacturing Method]

Figure 15:
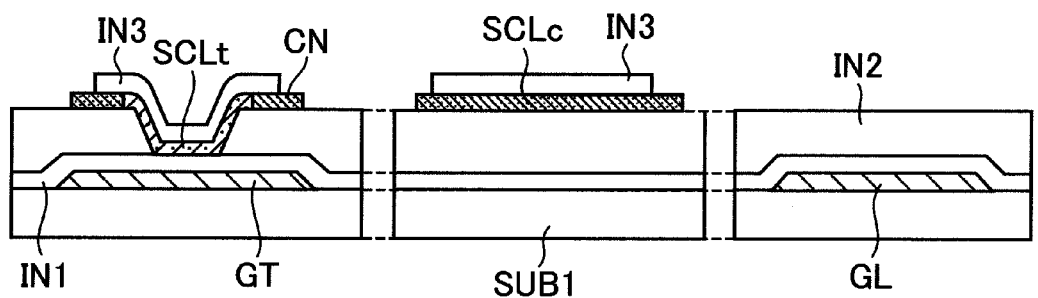
FIG. 15 is a view illustrating a step of a manufacturing method for the display device according to the second embodiment of the present invention, and illustrates a series of steps together with FIG. 16.

The early part of the manufacturing method of the second embodiment is the same as Step 1 to Step 6 of the manufacturing method of the first embodiment. FIG. 15 is the same diagram as that illustrating Step 6 of the manufacturing method of the first embodiment.

Figure 16:
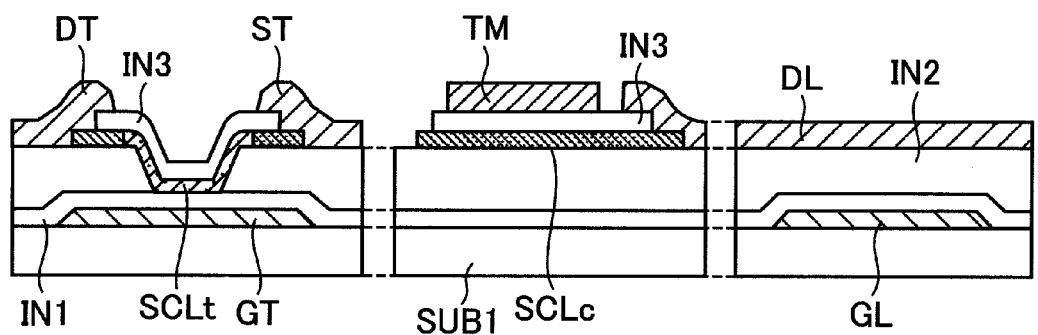
FIG. 16 is a view illustrating a step of the manufacturing method for the display device according to the second embodiment of the present invention, and illustrates a series of steps together with FIG. 15.

After that, as illustrated in FIG. 16, similarly to Step 7 of the first embodiment, the drain signal line DL and the drain electrode DT and the source electrode ST of the thin-film transistor TFT are formed. At the same time, in the area where the capacitor element C is formed, the maintaining electrode TM is formed on the upper surface of the third insulating film IN3. The maintaining electrode TM is formed without electrical connection to the capacitor signal line CLm. In this manner, the maintaining electrode TM is made of the same material as that of the drain signal line DL or the like, which is, for example, aluminum.

Then, as illustrated in FIG. 14, the protective film PAS made of, for example, a resin material is formed on a surface above the substrate SUB1. Further, in the area where the capacitor element C is formed, the through hole TH2 which exposes a part of the maintaining electrode TM is formed in the protective film PAS. Through the through hole TH2, the pixel electrode PX formed on the protective film PAS and the maintaining electrode TM are connected to each other.

[Third Embodiment]

[Structure]

Figure 17:
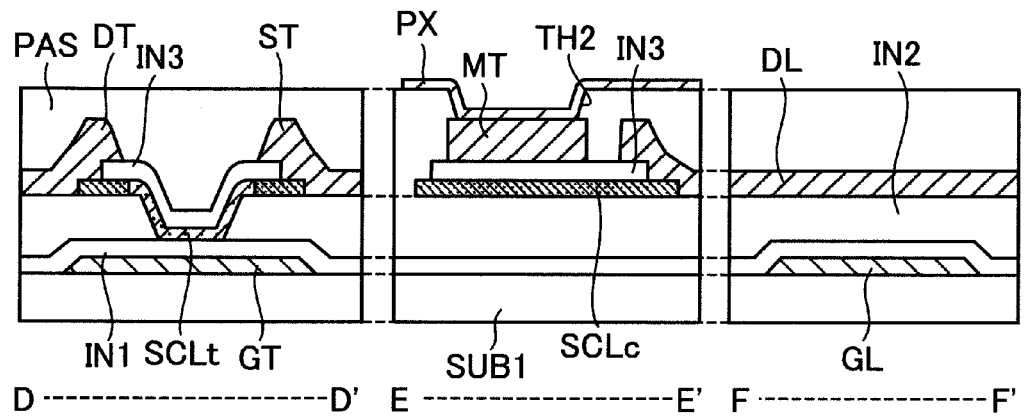
FIG. 17 is a cross-sectional view illustrating a principal part of a display device according to a third embodiment of the present invention.

FIG. 17 is a structure diagram illustrating a third embodiment of the present invention, which corresponds to the structure of FIG. 14 of the second embodiment. In FIG. 17, the structure differs from the case of FIG. 14 in that a maintaining electrode MT of the capacitor element C is formed slightly thicker than the case of FIG. 14. Therefore, the structure illustrating the plan view of the pixel is similar to that of FIG. 12, and the structure illustrating the plan view of the part of the gate driver GDR is similar to that of FIG. 13.

[Manufacturing Method]

Figure 18:
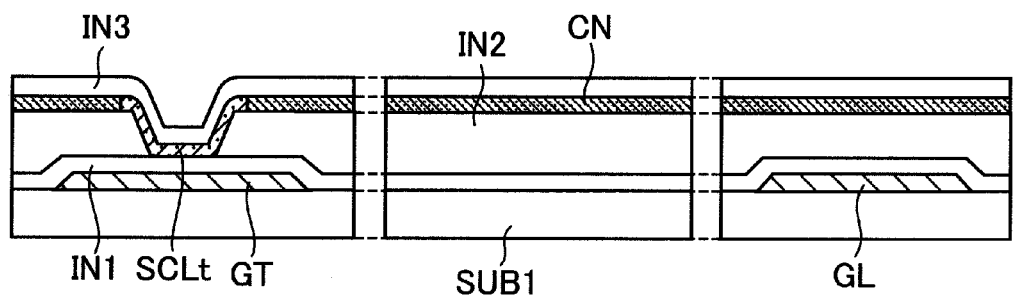
FIG. 18 is a view illustrating a step of a manufacturing method for the display device according to the third embodiment of the present invention, and illustrates a series of steps together with FIGS. 19 to 22.

The early part of the manufacturing method of the third embodiment is the same as Step 1 to Step 4 of the manufacturing method of the first embodiment. FIG. 18 is the same diagram as that illustrating Step 4 of the manufacturing method of the first embodiment.

Figure 19:
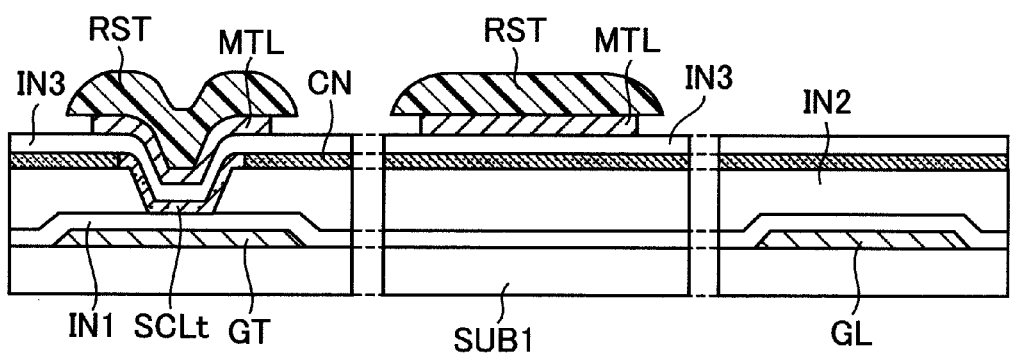
FIG. 19 is a view illustrating a step of the manufacturing method for the display device according to the third embodiment of the present invention, and illustrates a series of steps together with FIG. 18 and FIGS. 20 to 22.

Next, as illustrated in FIG. 19, on the surface of the third insulating film IN3, a metal film MTL made of, for example, aluminum is formed with a thickness of, for example, 300 nm.

Then, a photo resist is applied onto an upper surface of the metal film MTL. By using a photolithography technology, photo resist films RST are left unremoved. The photo resist films RST are formed as follows. In the area where the thin-film transistor TFT is formed, the photo resist film RST covering the area of the opening OP in the second insulating film and the area outside the opening where the high concentration semiconductor layer is formed is left unremoved. Further, in the area where the capacitor element C is formed, the photo resist film RST in a shape corresponding to a pattern of the electrode (lower layer electrode) which may be formed of the high concentration semiconductor layer CN, is left unremoved. Further, using the unremoved photo resist films RST as a mask, the metal film MTL is etched, to thereby expose the third insulating film IN3 formed below the metal film MTL. In this case, the metal film MTL is side-etched with respect to the photo resist film RST. A side-etching amount in this case is preferred to be equal to or larger than 1 μm.

Figure 20:
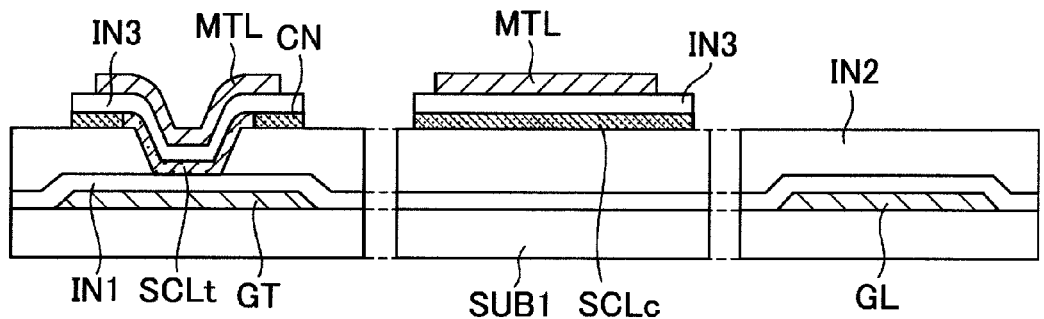
FIG. 20 is a view illustrating a step of the manufacturing method for the display device according to the third embodiment of the present invention, and illustrates a series of steps together with FIGS. 18 and 19 and FIGS. 21 and 22.

Next, as illustrated in FIG. 20, using the photo resist films RST as a mask, the third insulating film IN3 and the high concentration semiconductor layer CN are sequentially etched, to thereby expose the second insulating film IN2 formed below the high concentration semiconductor layer CN. Further, the photo resist films RST are removed. By the side-etching step of the metal film MTL in FIG. 19, the third insulating film IN3 is exposed in the circumference of the metal film MTL in plan view.

Figure 21:
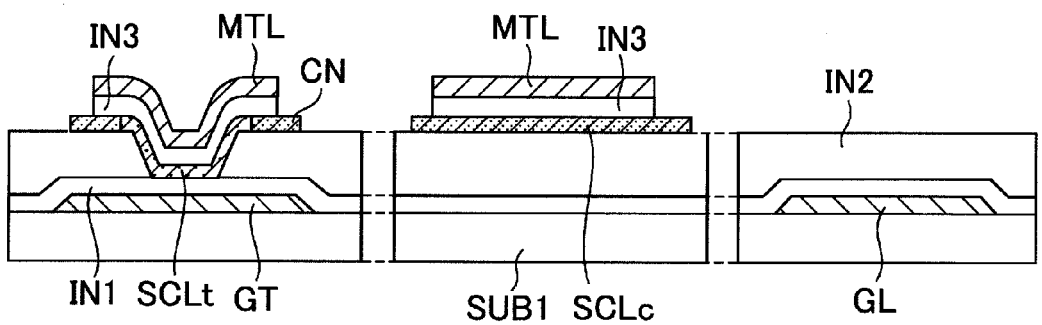
FIG. 21 is a view illustrating a step of the manufacturing method for the display device according to the third embodiment of the present invention, and illustrates a series of steps together with FIGS. 18 to 20 and FIG. 22.

Next, as illustrated in FIG. 21, using the metal film MTL as a mask, the third insulating film IN3 is etched, to thereby expose a part of the high concentration semiconductor layer CN.

Figure 22:
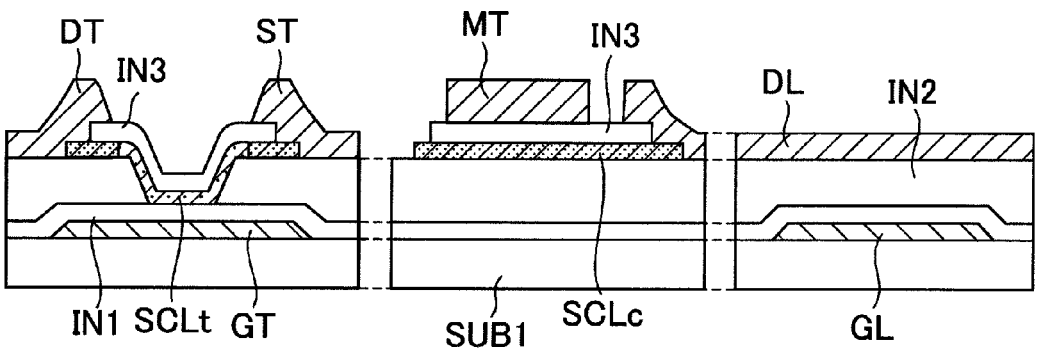
FIG. 22 is a view illustrating a step of the manufacturing method for the display device according to the third embodiment of the present invention, and illustrates a series of steps together with FIGS. 18 to 21.

Next, as illustrated in FIG. 22, the drain signal line DL, the drain electrode DT and the source electrode ST of the thin-film transistor TFT, and the maintaining electrode MT of the capacitor element C are formed. In this case, while leaving the metal film MTL unremoved, a new metal film is formed in the upper layer thereof. In this state, the drain signal line DL, the drain electrode DT and the source electrode ST of the thin-film transistor TFT, and the maintaining electrode MT of the capacitor element C are formed. Therefore, a thickness of the maintaining electrode MT of the capacitor element C becomes large.

Then, as illustrated in FIG. 17, on a surface above the substrate SUB1, the protective film PAS made of, for example, a resin material is formed. After that, in the area where the capacitor element C is formed, the through hole TH2 which exposes apart of the maintaining electrode MT is formed in the protective film PAS. Through the through hole TH2, the pixel electrode PX formed on the protective film PAS and the maintaining electrode MT are connected to each other.

In the above-mentioned manufacturing method, the metal film MTL is formed on the upper surface of the third insulating film IN3, and the metal film MTL is subjected to side etching. In this manner, a contact region between the source/drain electrode and the high concentration semiconductor layer is formed in the area where the thin-film transistor TFT is formed. With this, the following effects are provided. That is, without considering the amount of side etching, the thickness of the third insulating film IN3 may be significantly reduced (for example, about 50 nm) and capacitance stored in the capacitor element C may be increased.

[Fourth Embodiment]
[Structure of Part of Gate Driver]

Figure 23:
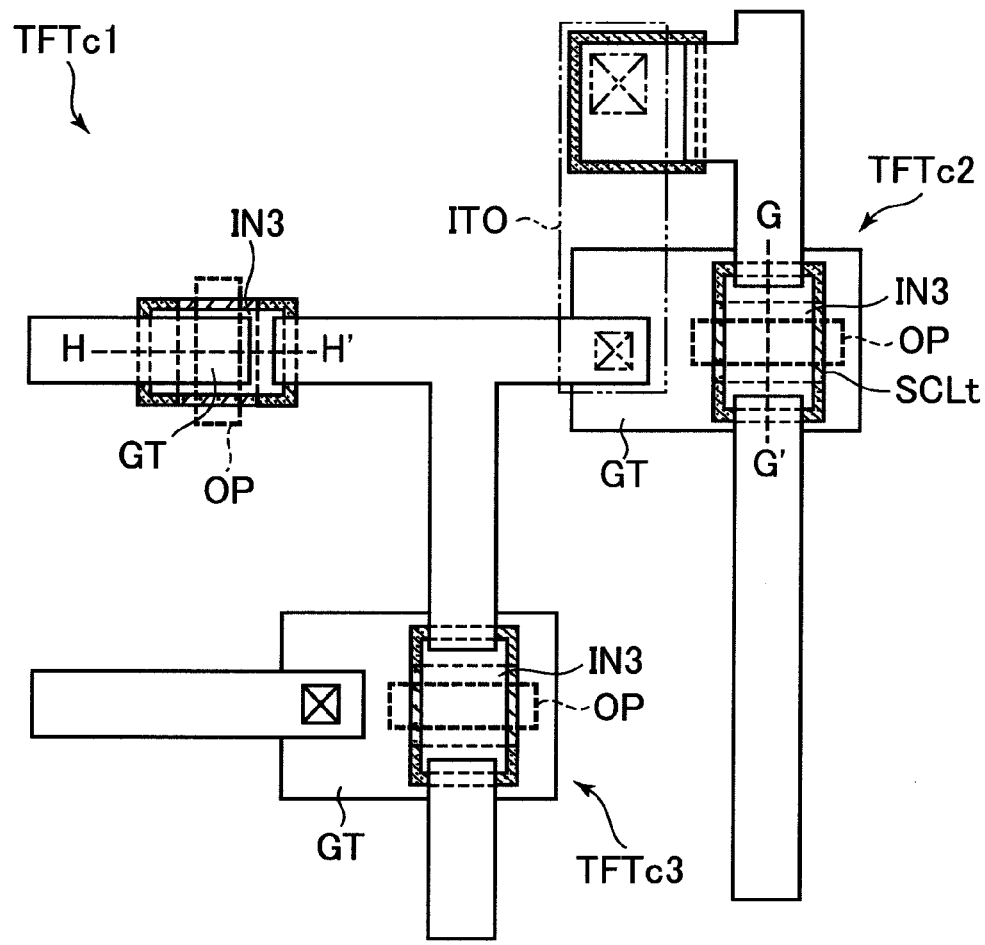
FIG. 23 is a plan view illustrating a structure of a bootstrap circuit formed in a display device according to a fourth embodiment of the present invention.

FIG. 23 is a schematic plan view illustrating the fourth embodiment of the present invention, which corresponds to FIG. 4. Further, schematic cross-sectional views taken along the line G-G' and the line H-H' of FIG. 23 are illustrated in the part G-G' and the part H-H' of FIG. 24, respectively.

In FIG. 23, a structure in the thin-film transistor TFTc1 differs from that in the case of FIG. 4. The thin-film transistor TFTc1 is formed so that the gate electrode GT is electrically connected to the drain electrode DT, to thereby function as a diode. Further, the thin-film transistor TFTc1 is formed as a top-gate type thin-film transistor. That is, in the area where the thin-film transistor TFTc1 is formed, the gate electrode GT is not formed in the lower layer of the first insulating film IN1. Alternatively, the drain electrode DT which is formed in the thin-film transistor TFTc1 is extended to the source electrode ST side, to thereby be embedded in the opening OP formed in the second insulating film IN2. The extending portion of the drain electrode DT formed as described above serves as the gate electrode GT. In this case, the third insulating film IN3 functions as the gate insulating film of the thin-film transistor TFTc1.

The thin-film transistor TFTc1 formed as described above may be significantly reduced in element size compared with the thin-film transistor in which connection between the drain electrode DT and the gate electrode GT is provided through the through hole as illustrated in, for example, FIG. 4.

[Manufacturing Method]

A manufacturing method of the display device is described with reference to FIGS. 25 to 30. FIGS. 25 to 30 are diagrams provided so as to correspond to FIG. 24. Hereinafter, steps are described in order of manufacture.

Figure 25:
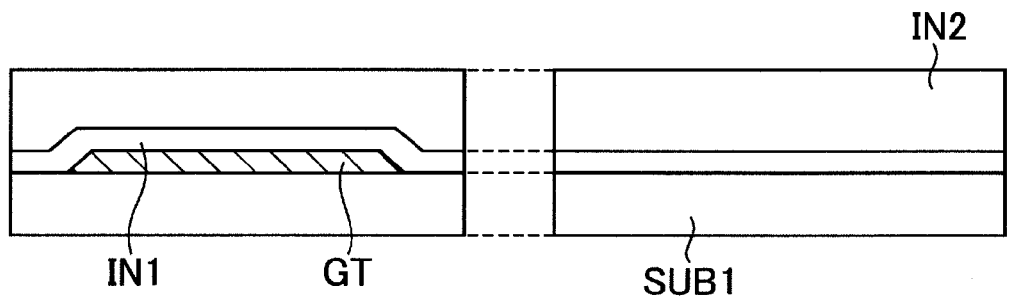
FIG. 25 is a view illustrating a step of a manufacturing method for the display device according to the fourth embodiment of the present invention, and illustrates a series of steps together with FIGS. 26 to 30.

Step 1 (FIG. 25)

The substrate SUB1 made of, for example, glass is prepared. In the area where the bottom-gate type thin-film transistor TFT is formed, the gate electrode GT which is made of, for example, aluminum, is formed on the surface the substrate SUB1. The film thickness of the gate electrode GT is, for example, 150 nm. In the area where the top-gate type thin-film transistor TFT is formed, the gate electrode is not formed in this stage. After that, on the surface of the substrate SUB1, the first insulating film IN1 made of silicon oxide and the second insulating film IN2 made of silicon nitride are sequentially formed so as to cover the gate electrode GT as well. The first insulating film IN1 and the second insulating film IN2 are sequentially formed by, for example, the CVD method. The first insulating film IN1 has a thickness of, for example, 100 nm, and the second insulating film IN2 has a thickness of, for example, 500 nm.

Figure 26:
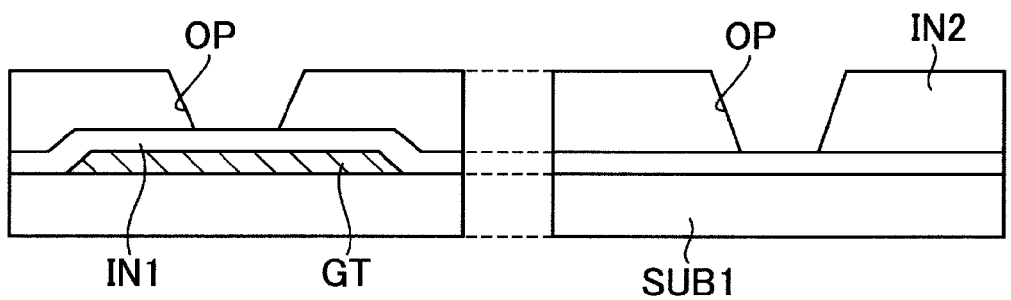
FIG. 26 is a view illustrating a step of the manufacturing method for the display device according to the fourth embodiment of the present invention, and illustrates a series of steps together with FIG. 25 and FIGS. 27 to 30.

Step 2 (FIG. 26)

The openings OP are formed in the second insulating film IN2 in both areas where the thin-film transistors TFT of the bottom-gate type and the top-gate type are formed. The opening OP in the area where the bottom-gate type thin-film transistor TFT is formed is formed on the upper side of the gate electrode GT. The openings OP are formed so as to have a tapered side wall surface. Further, the openings OP are formed by a well-known photo-etching. During the photo-etching, a hole may be prevented from being formed in the first insulating film IN1 because of difference in etching rate.

Figure 27:
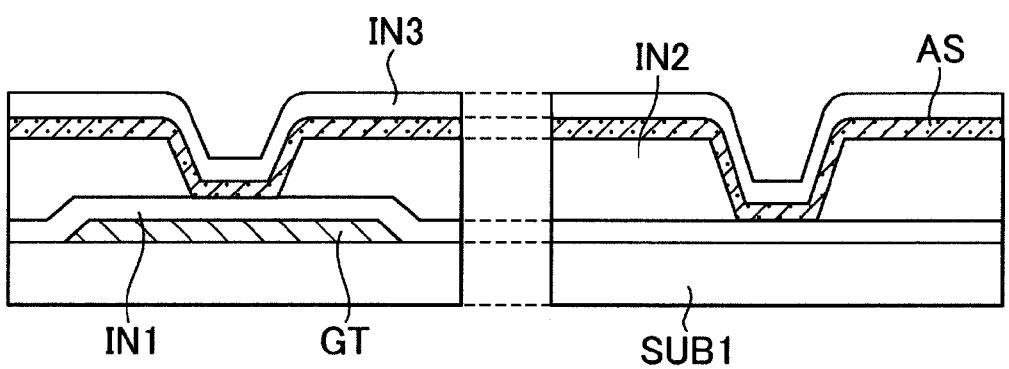
FIG. 27 is a view illustrating a step of the manufacturing method for the display device according to the fourth embodiment of the present invention, and illustrates a series of steps together with FIGS. 25 and 26 and FIGS. 28 to 30.

Step 3 (FIG. 27)

On the upper surface of the second insulating film IN2, a semiconductor layer AS made of amorphous silicon and the third insulating film IN3 made of silicon oxide are sequentially formed so as to cover the opening OP as well. The semiconductor layer AS and the third insulating film IN3 are sequentially formed by, for example, the chemical vapor deposition (CVD) method. The semiconductor layer AS has a thickness of, for example, 50 nm, and the third insulating film IN3 has a thickness of, for example, 200 nm.

Figure 28:
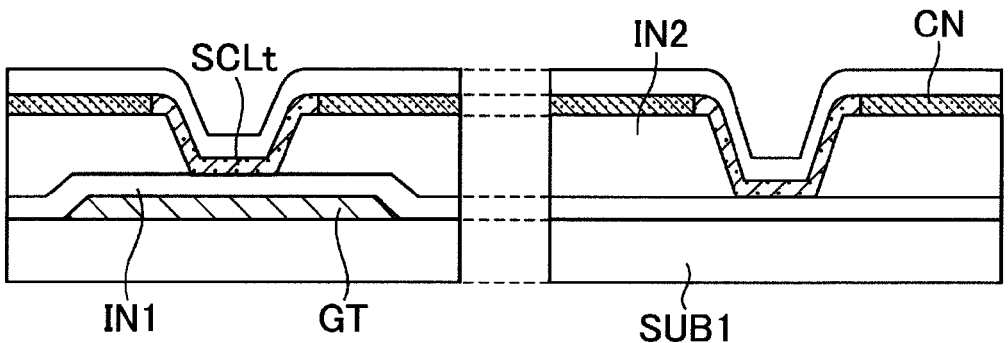
FIG. 28 is a view illustrating a step of the manufacturing method for the display device according to the fourth embodiment of the present invention, and illustrates a series of steps together with FIGS. 25 to 27 and FIGS. 29 and 30.

Step 4 (FIG. 28)

Ion implantation is performed on the semiconductor layer AS through the third insulating film IN3. In this case, a mask is formed to avoid performing ion implantation on a part of the semiconductor layer AS, which is formed on the opening OP in the second insulating film IN2 and the periphery thereof. After that, the semiconductor layer AS is subjected to laser annealing. The high concentration semiconductor layer CN having low resistance is formed at the portion where ion implantation is performed, while the polycrystalline semiconductor layer SCLt is formed at the portion where ion implantation is avoided. In this case, in the crystallization step using laser annealing, the semiconductor layer AS made of amorphous silicon is once melted. However, because the third insulating film IN3 is formed, similarly to the above-mentioned embodiments, the polycrystalline semiconductor layer SCLt may be formed without stepped separation along the tapered surface of the opening OP in the second insulating film IN2.

Figure 29:
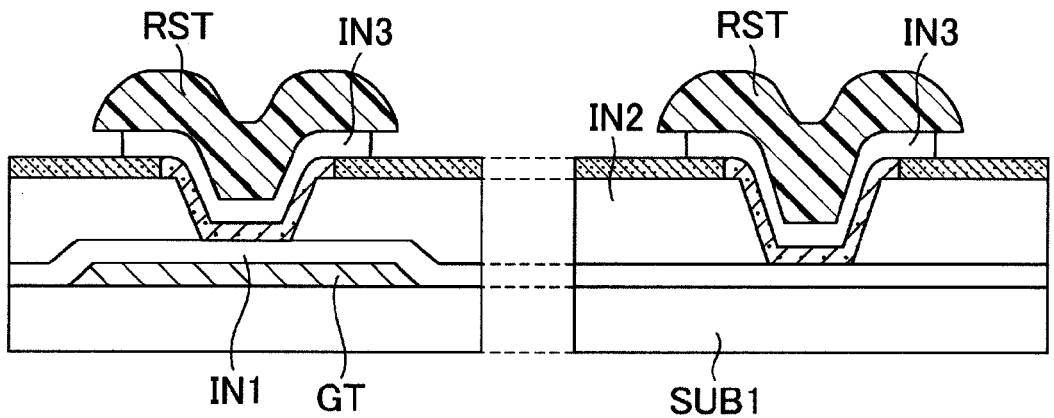
FIG. 29 is a view illustrating a step of the manufacturing method for the display device according to the fourth embodiment of the present invention, and illustrates a series of steps together with FIGS. 25 to 28 and FIG. 30.

Step 5 (FIG. 29)

A photo resist is applied onto the upper surface of the third insulating film IN3. By using a photolithography technology, in each area where the thin-film transistors TFT is formed, a photo resist film RST covering the area of the opening OP in the second insulating film and the area outside the opening where the high concentration semiconductor layer CN is formed is left unremoved. Further, using the unremoved photo resist film RST as a mask, a part of the third insulating film IN3 is etched, to thereby expose the high concentration semiconductor layer CN formed below the third insulating film IN3. In this case, the third insulating film IN3 is side-etched with respect to the photo resist film RST. A side-etching amount in this case is preferred to be equal to or larger than 1 μm.

Figure 30:
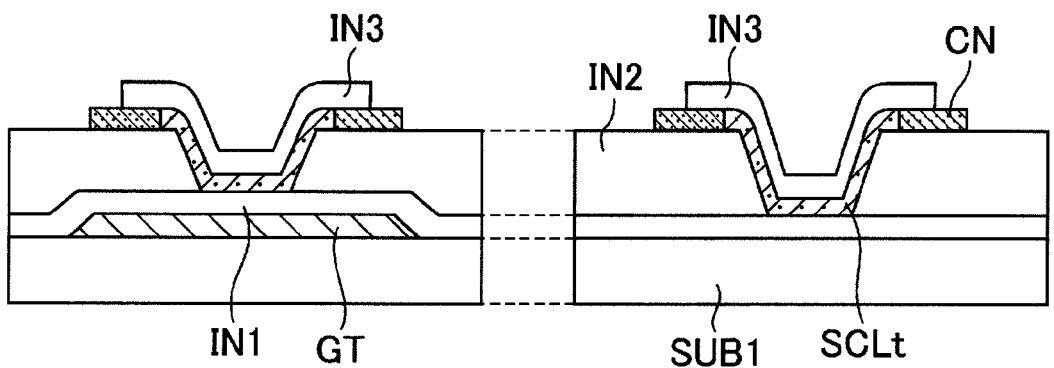
FIG. 30 is a view illustrating a step of the manufacturing method for the display device according to the fourth embodiment of the present invention, and illustrates a series of steps together with FIGS. 25 to 29.

Step 6 (FIG. 30)

Using the photo resist films RST as a mask, the high concentration semiconductor layer CN is etched, to thereby expose the second insulating film IN2 formed below the high concentration semiconductor layer. Then, the photo resist films RST are removed. By the side-etching step of the third insulating film IN3 in Step 5, the high concentration semiconductor layer CN is exposed in the circumference of the third insulating film IN3 in plan view.

Figure 24:
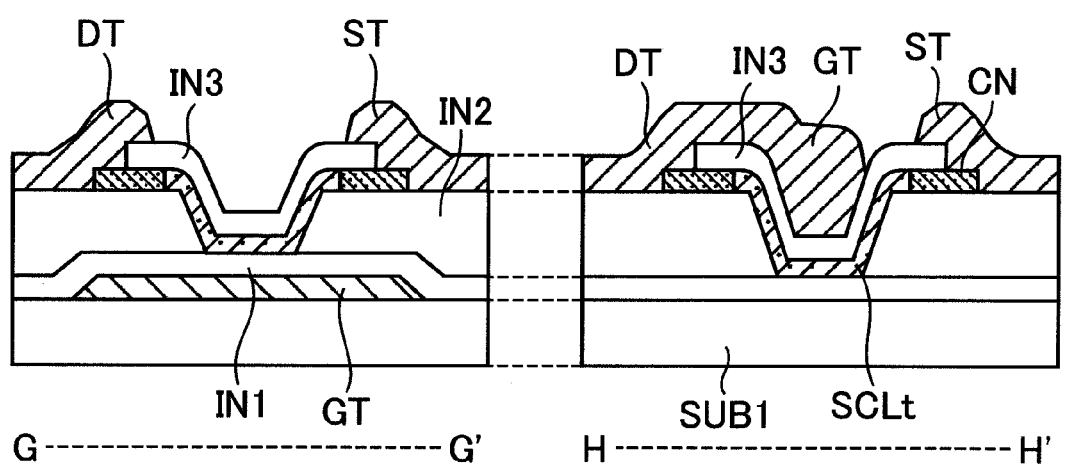
FIG. 24 is a cross-sectional view illustrating a principal part of the display device according to the fourth embodiment of the present invention.

After that, as illustrated in FIG. 24, in the area where the bottom-gate type thin-film transistor TFT is formed, the drain electrode DT and the source electrode ST are formed. The drain electrode DT and the source electrode ST are formed so as to overlap at least the high concentration semiconductor layer CN exposed in the circumference of the third insulating film IN3. Further, in the area where the top-gate type thin-film transistor TFT is formed, the drain electrode DT, the source electrode ST, and the gate electrode GT are formed. The gate electrode GT is formed by extending the end of the drain electrode DT to the source electrode ST side, and embedding the gate electrode GT in the opening OP formed in the second insulating film IN2. The electrodes described above are formed by applying, for example, aluminum onto a surface above the substrate SUB1, and then patterning the aluminum film. The aluminum film has a thickness of, for example, 500 nm.

[Fifth Embodiment]

Figure 31:
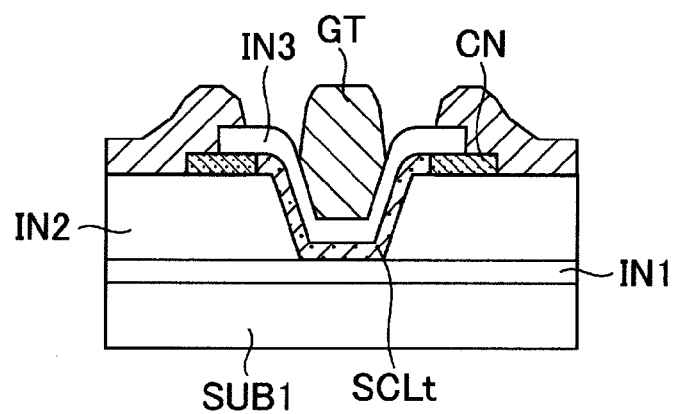
FIG. 31 is a cross-sectional view illustrating a thin-film transistor formed in a display device according to a fifth embodiment of the present invention.

The top-gate type thin-film transistor TFT of the fourth embodiment is employed for the thin-film transistor functioning as a diode. However, for example, a top-gate type structure may be employed for a part of the thin-film transistors TFT functioning as a transistor. FIG. 31 illustrates a structure diagram (cross-sectional view) in this case. In FIG. 31, the gate electrode GT is formed so as to be embedded in the opening OP in the second insulating film IN2. In this manner, the gate electrode GT is applied with a signal different from the signal applied to the drain electrode DT and the source electrode ST.

[Sixth Embodiment]

Figure 32:
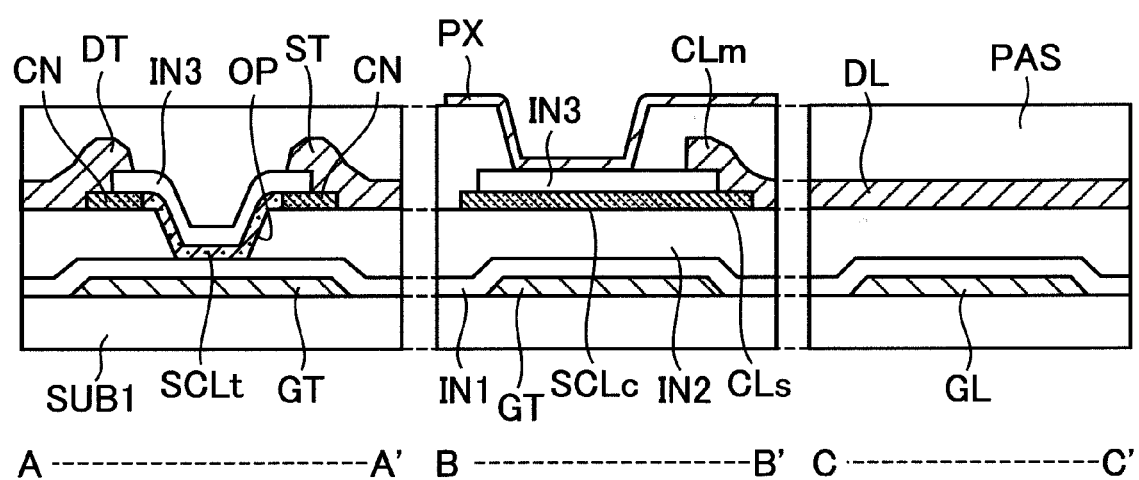
FIG. 32 is a cross-sectional view illustrating a principal part of a display device according to a sixth embodiment of the present invention.

In each of the embodiments described above, the capacitor element C is formed between the polycrystalline semiconductor layer SCLc and the pixel electrode PX. In addition, as illustrated in FIG. 32, the gate electrode GT may be formed on a lower side of the polycrystalline semiconductor layer SCLc, to thereby form a capacitor element also between the polycrystalline semiconductor layer SCLc and the gate electrode GT. In this case, the retention capacitor is a parallel element including the capacitor element formed of the polycrystalline semiconductor layer SCLc and the pixel electrode PX and the capacitor element formed of the polycrystalline semiconductor layer SCLc and the gate electrode GT. Therefore, the capacitance may be further increased. Note that, although FIG. 32 illustrates a case where the structure described above is applied to the capacitor element of the first embodiment as an example, this embodiment is applicable to the capacitor elements of the second embodiment and the third embodiment described above.

[Seventh Embodiment]

In each of the embodiments described above, for example, glass is used as a material of the substrate. However, the material of the substrate is not limited thereto, and quartz glass or a resin may also be used. By using quartz glass for the substrate, a process temperature may be increased so that, for example, the gate insulating film may be densified. As a result, the reliability of characteristics of the thin-film transistor may be improved. Further, by using a resin for the substrate, the light-weight liquid crystal display device excellent in impact resistance may be obtained.

[Eighth Embodiment]

In each of the embodiments described above, a silicon oxide film is formed as the gate insulating film of the thin-film transistor TFT. However, the gate insulating film is not limited thereto, and the gate insulating film may be formed of a laminate film of a silicon oxide film and a silicon nitride film. In this manner, impurities from the substrate SUB1 may be prevented from being diffused into the gate insulating film. Further, characteristic fluctuation of the thin-film transistor TFT may be prevented.

[Ninth Embodiment]

In each of the embodiments described above, the amorphous silicon film is crystallized into a polysilicon film by laser annealing, to thereby form the semiconductor layer. However, the method of crystallizing the amorphous silicon film is not limited thereto. A solid-phase growth method with thermal annealing may be used, or thermal annealing and laser annealing may be performed in combination. Alternatively, the polysilicon may be directly formed by using PECVD or reactive thermal CVD. By employing a method such as PECVD or reactive thermal CVD to directly form the polysilicon, the number of manufacturing processes may be reduced, to thereby allow a throughput to be improved. Further, for the semiconductor layer, microcrystalline silicon having a particle diameter of about 20 nm to 100 nm may be used. Alternatively, a compound of silicon and germanium may also be used. When using a compound of silicon and germanium, the performance of the thin-film transistor TFT may be improved.

[Tenth Embodiment]

In each of the embodiments described above, the material of the barrier film of the gate electrode and the source/drain electrode is made of molybdenum (Mo). However, a metal such as Ti, TiW, TiN, W, Cr, Ta, Nb, or an alloy thereof may be used.

[Eleventh Embodiment]

The embodiments described above have been described taking a liquid crystal display device as an example of the display device. However, the present invention is not limited thereto, and the present invention is also applicable to other display device such as, for example, an organic electroluminescence (EL) display device. This is because, also in the organic EL display device, pixel drive may be performed by forming such thin-film transistors as described above.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising a thin-film transistor and a capacitor element which are formed on a substrate, wherein:
the thin-film transistor comprises:
a first insulating film which is formed to cover an area where a gate electrode is formed;
a second insulating film which is formed on the first insulating film, the second insulating film having an opening formed in the area where the gate electrode is formed in plan view;
a semiconductor layer which is formed in an island shape on the second insulating film to cross the opening and is polycrystalline, the semiconductor layer including high concentration areas formed at both ends of the semiconductor layer;
a third insulating film which is formed on an upper surface of the semiconductor layer to expose a part of each of the high concentration areas formed at the both ends of the semiconductor layer; and
a pair of electrodes each having electrical connection to the part of each of the high concentration areas formed at the both ends of the semiconductor layer, the part being exposed at the third insulating film; and
the capacitor element comprises a dielectric film which is formed of an insulating film formed of the same layer and the same material as the third insulating film.

2. The display device according to claim 1, wherein the capacitor element is formed of a laminate obtained by sequentially laminating a lower electrode, the third insulating film, and an upper electrode on the second insulating film.

3. The display device according to claim 2, wherein the lower electrode is formed of a high concentration semiconductor layer which is formed of the same layer as the semiconductor layer of the thin-film transistor.

4. The display device according to claim 2, wherein:
the thin-film transistor and the capacitor element are covered with a protective film; and
the upper electrode of the capacitor element is formed of a extending portion of a pixel electrode formed on an upper surface of the protective film, the extending portion being extended to cover a through hole formed in the protective film, the through hole being formed to expose a part of the third insulating film.

5. The display device according to claim 2, wherein the upper electrode of the capacitor element is formed of the same layer and the same material as the pair of electrodes of the thin-film transistor.

6. The display device according to claim 1, wherein the gate electrode is formed in a lower layer of the first insulating film.

7. The display device according to claim 6, wherein:
the gate electrode of the thin-film transistor is electrically connected to a gate signal line;
the pair of electrodes of the thin-film transistor include one electrode electrically connected to a drain signal line; and
the gate signal line and the drain signal line have an intersecting portion where an interlayer insulating film is formed therebetween, the interlayer insulating film being formed of a laminate obtained by sequentially laminating the first insulating film and the second insulating film.

8. A manufacturing method for a display device comprising a thin-film transistor and a capacitor element which are formed on a substrate, wherein:
the thin-film transistor is formed by:
a first step of forming a first insulating film which covers an area where a gate electrode is formed on the substrate;
a second step of forming a second insulating film on the first insulating film and forming an opening in the area where the gate electrode is formed in plan view;
a third step of sequentially forming an amorphous semiconductor layer and a third insulating film, the amorphous semiconductor layer having a high concentration area in an area excluding an area on the opening in the second insulating film and a peripheral portion thereof in plan view;
a fourth step of performing annealing to the amorphous semiconductor layer to obtain a polycrystalline semiconductor layer;
a fifth step of performing selective etching to leave a part of the third insulating film on the opening in the second insulating film and the peripheral portion thereof in plan view, and performing selective etching to leave a part of the polycrystalline semiconductor layer in a state in which the high concentration area is exposed in a circumference of the part of the third insulating film unetched; and
a sixth step of forming a pair of electrodes which contact with the high concentration area in the semiconductor layer, the high concentration area being exposed at the third insulating film; and
the capacitor element comprises a dielectric film formed by subjecting the third insulating film formed in the third step to the selective etching of the third insulating film in the fifth step.

9. The manufacturing method for a display device according to claim 8, wherein the capacitor element comprises a lower electrode formed by subjecting the polycrystalline semiconductor layer formed in the high concentration area in the fourth step to the selective etching of the polycrystalline semiconductor layer in the fifth step.

10. The manufacturing method for a display device according to claim 8, comprising, after the sixth step:
a seventh step of forming a protective film which covers the thin-film transistor and the capacitor element, and forming a through hole in an area where the capacitor element is formed of the protective film, the through hole exposing a part of the third insulating film; and
an eighth step of forming a pixel electrode on an upper surface of the protective film, and forming an upper electrode of the capacitor element, the upper electrode being formed of an extending portion of the pixel electrode formed to cover the through hole.

11. The manufacturing method for a display device according to claim 8, wherein the capacitor element includes an upper electrode formed of the same material as the pair of electrodes formed in the sixth step.

12. The manufacturing method for a display device according to claim 8, comprising a step of forming a gate signal line formed of the same layer and the same material as the gate electrode of the thin-film transistor, and forming a drain signal line formed of the same layer and the same material as the pair of electrodes of the thin-film transistor, to thereby form an interlayer insulating film at an intersecting portion of the gate signal line and the drain signal line, the interlayer insulating film comprising a laminate obtained by sequentially laminating the first insulating film and the second insulating film.

* * * * *